(12) United States Patent
Abe (10) Patent No.: US 10,396,526 B2
(45) Date of Patent: Aug. 27, 2019

(54) DISPLAY APPARATUS

(71) Applicant: Misato Abe, Tokyo (JP)

(72) Inventor: Misato Abe, Tokyo (JP)

(73) Assignee: MITSUMI ELECTRIC CO., LTD., Tokyo (JP)

(*) Notice: Subject to any disclaimer, the term of this patent is extended or adjusted under 35 U.S.C. 154(b) by 0 days.

(21) Appl. No.: 15/919,420

(22) Filed: Mar. 13, 2018

(65) Prior Publication Data
US 2018/0284442 A1   Oct. 4, 2018

(30) Foreign Application Priority Data

Mar. 31, 2017   (JP) ................................. 2017-069782

(51) Int. Cl.
| | |
|---|---|
| *H01S 5/026* | (2006.01) |
| *H01S 5/042* | (2006.01) |
| *H01S 5/0683* | (2006.01) |
| *H01S 5/40* | (2006.01) |
| *H04N 9/31* | (2006.01) |
| *G02B 27/01* | (2006.01) |
| *H01S 5/068* | (2006.01) |

(52) U.S. Cl.
CPC ........ *H01S 5/0261* (2013.01); *G02B 27/0172* (2013.01); *H01S 5/042* (2013.01); *H01S 5/0427* (2013.01); *H01S 5/06832* (2013.01); *H01S 5/4093* (2013.01); *H04N 9/3129* (2013.01); *H04N 9/3135* (2013.01); *H04N 9/3155* (2013.01); *H04N 9/3161* (2013.01); *H04N 9/3164* (2013.01); *G02B 2027/0118* (2013.01); *G02B 2027/0147* (2013.01); *G02B 2027/0178* (2013.01); *H01S 5/06825* (2013.01); *H04N 9/3182* (2013.01)

(58) Field of Classification Search
CPC ...... H01S 5/0261; H01S 5/4093; H01S 5/042; G02B 27/0172; G02B 2027/0178; G02B 2027/0147; H04N 9/3155; H04N 9/3164; H04N 9/3161; H04N 9/3129
See application file for complete search history.

(56) References Cited

U.S. PATENT DOCUMENTS

| | | |
|---|---|---|
| 4,177,436 A | 12/1979 | Dixon et al. |
| 5,371,755 A | 12/1994 | Murata et al. |

(Continued)

FOREIGN PATENT DOCUMENTS

| | | |
|---|---|---|
| DE | 102009004117 | 7/2010 |
| JP | 2001-257420 | 9/2001 |

OTHER PUBLICATIONS

Extended European search report for European Patent Application No. 18163704.2 dated Aug. 17, 2018.

*Primary Examiner* — Yuanda Zhang
(74) *Attorney, Agent, or Firm* — IPUSA, PLLC (57) ABSTRACT

A display apparatus is provided. The display apparatus is a retinal scanning type display apparatus, and includes a low output laser whose operational current is less than that of a standard output laser; a shunting element that is connected in parallel with the low output laser; and a drive circuit that supplies a current to the low output laser and the shunting element. The drive circuit is a drive circuit for the standard output laser capable of adjusting a current value on a discrete basis in a range of an operational current that is higher than the operational current of the low output laser.

5 Claims, 10 Drawing Sheets

(56) References Cited

U.S. PATENT DOCUMENTS

| | | |
|---|---|---|
| 6,278,476 B1 | 8/2001 | Ueno |
| 2012/0140784 A1* | 6/2012 | Quirk .................... G02B 27/48 |
| | | 372/29.015 |
| 2012/0188623 A1 | 7/2012 | Inoue |
| 2014/0226688 A1* | 8/2014 | Ortiz .................... H01S 5/0427 |
| | | 372/38.02 |
| 2017/0059856 A1* | 3/2017 | Wagatsuma ............. G09G 3/00 |

* cited by examiner

DISPLAY APPARATUS

BACKGROUND OF THE INVENTION

1. Field of the Invention

The present invention relates to a display apparatus.

2. Description of the Related Art

In a display apparatus that is used for causing a user to view a predetermined video, there is a case in which a semiconductor laser is used as a light source. In general, characteristics of a semiconductor laser vary greatly according to temperature and the emission power may change even when the semiconductor laser is driven by the same electric current value. Therefore, an APC (Auto Power Control) is used that maintains the emission power at a constant level (refer to, e.g., Patent Document 1).

In general, in a display apparatus as described above, a laser is used whose emission power is about several ten mW, and the laser is driven by a dedicated drive circuit that is capable of adjusting the electric current value on a discrete basis in the whole range of the operational current corresponding to the emission power.

CITATION LIST

Patent Document

[Patent Document 1] Japanese Unexamined Patent Application Publication No. 2001-257420

SUMMARY OF THE INVENTION

Here, as such a display apparatus that is used for causing a user to view a predetermined video, there is a retinal scanning type display apparatus that is attached to the user's head, and that is used for causing the user to view an image by directly scanning the light on the retinal of the user to form an image. In the retinal scanning type display apparatus, taking safety into consideration, there is a case in which a low output laser (whose emission power is equal to or less than about 10 mW) is used, whose emission power is less than that of a typical laser (whose emission power is about 10 mW).

Because of the fact that a dedicated drive IC that is dedicated to drive a low output laser does not exist at the moment, even in the case of using a low output laser, it is assumed that the low output laser is used still in combination with a drive IC that is used for a laser with a typical output. However, the operational current of a low output laser is about a fifth of the operational current of a laser with a typical output. Therefore, when the low output laser is used in combination with a drive IC that is used for a laser with a typical output, only adjustable current values on the low current side, which is only a part of the whole range, can be used. Therefore, there is a problem that the sufficient current value adjustment resolution cannot be obtained.

In view of the above, the present invention has been made. An object of the present invention is to improve the current value adjustment resolution in the case where a low output laser, which is mounted on a retinal scanning type display apparatus, is driven by not using a dedicated drive IC.

Solution to Problem

A display apparatus (1) is provided. The display apparatus (1) is a retinal scanning type display apparatus (1), and includes a low output laser (211R) whose operational current is less than that of a standard output laser; a shunting element (212R) that is connected in parallel with the low output laser (211R); and a drive circuit (26) that supplies a current to the low output laser (211R) and the shunting element (212R), wherein the drive circuit (26) is a drive circuit for the standard output laser capable of adjusting the current value on a discrete basis in a range of the operational current that is higher than the operational current of the low output laser (211R).

It should be noted that reference numerals in the above parentheses are provided in order to facilitate easy understanding, are just examples, and are not limited to aspects illustrated in the drawings.

Advantageous Effects of Invention

According to an embodiment of the present invention, it is possible to improve the current value adjustment resolution in the case where a low output laser mounted on a retinal scanning type display apparatus is driven by not using a dedicated drive IC.

DETAILED DESCRIPTION OF THE PREFERRED EMBODIMENTS

In the following, embodiments of the present invention will be described while making reference to the drawings. Throughout the drawings, a same reference numeral is given to a same element, and duplicated descriptions may be omitted.

(Overview of Display Apparatus)

Figure 1:
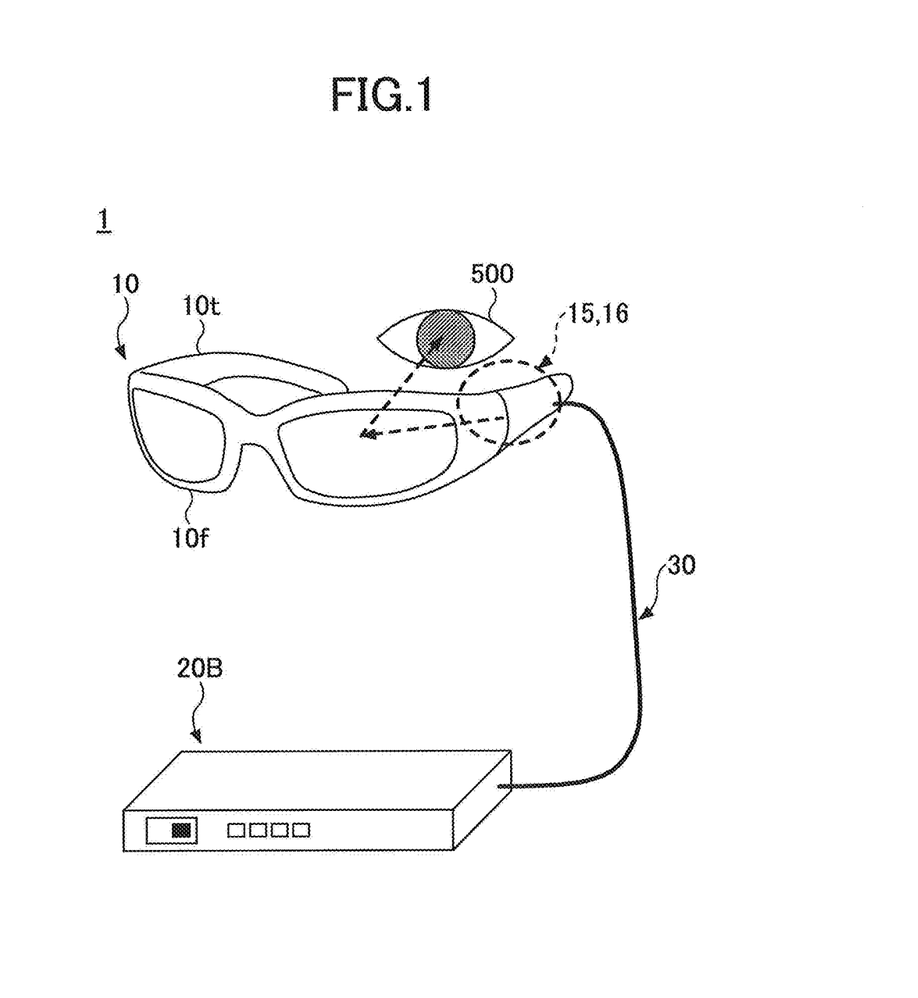
FIG. 1 is a perspective view illustrating an example of an appearance of a display apparatus according to an embodiment of the present invention.
Figure 2:
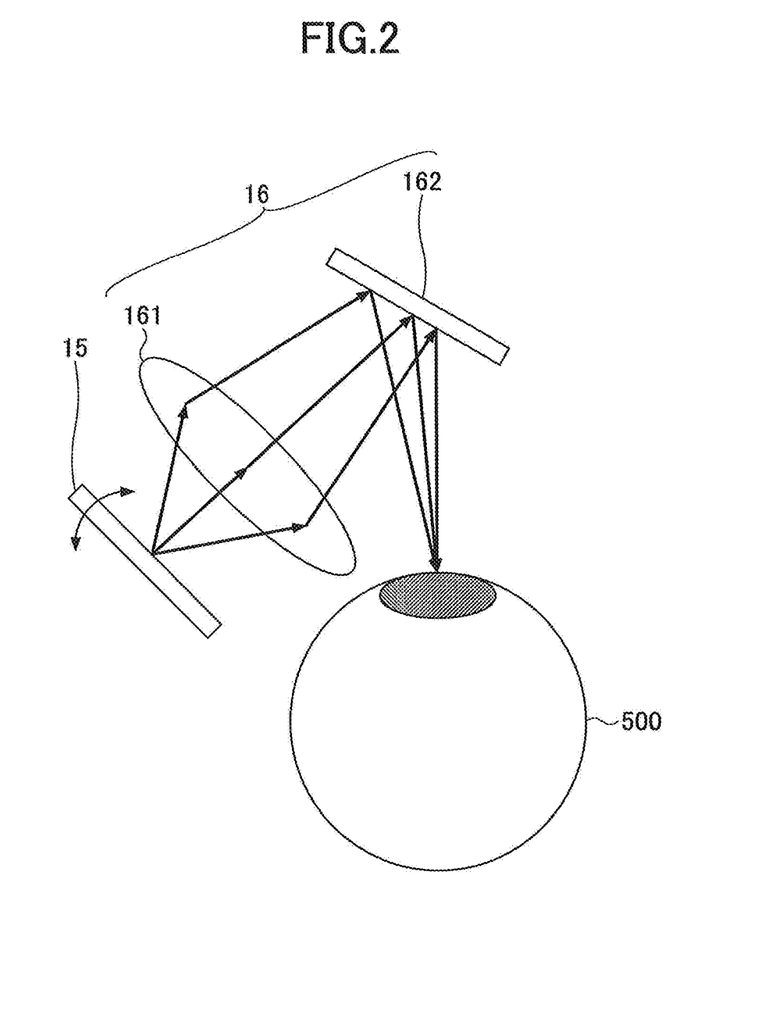
FIG. 2 is a schematic diagram illustrating an example of a projection optical system of a display apparatus according to an embodiment of the present invention.

FIG. 1 is a perspective view illustrating an example of an appearance of a display apparatus 1 according to an embodiment of the present invention. FIG. 2 is a schematic diagram illustrating an example of a projection optical system of a display apparatus 1 according to an embodiment of the present invention.

The display apparatus 1 illustrated in FIG. 1 and FIG. 2 is a retinal scanning type head-mount display that directly projects an image on the retinal of an eye of the user.

The display apparatus 1 can be used, for example, as an apparatus for causing a user to view information for work assistance, which has been recorded beforehand in a database, etc. Alternatively, a camera module may be included in the display apparatus 1, and the display apparatus 1 may be used as an apparatus for causing a user to view information obtained by the camera module. Alternatively, the display apparatus 1 may be an apparatus that has functions of both of the above-described apparatuses.

The display apparatus 1 includes, as main elements, an attachment unit 10 that can be attached to the head of a user (a person to whom the display apparatus 1 is attached), and a control box 20B in which a control apparatus 20 (described below) that controls the attachment unit 10 is built (included). The control box 20B is, for example, a rectangular housing, and may include various types of switches, a display unit, etc., if necessary. The attachment unit 10 is connected to the control apparatus 20 in the control box 20B via a transmission cable 30 that includes an optical fiber or an electric wire.

According to an embodiment of the present invention, the attachment unit 10 is, as an example, an eyeglass type, which includes two sets of a front part 10f and a side (temple) part 10t, the sets being provided substantially symmetrically on the left and right. The front part 10f includes a lens (including a lens without optical correction).

In one of the temple parts 10t on the left and right (the temple part 10t on the left eye side in FIG. 1), an optical scanning unit 15 and a projection optical system 16 including a lens 161 and a half mirror 162 illustrated in FIG. 2 are installed. In other words, in the display apparatus 1, the optical scanning unit 15 and the projection optical system 16 are installed only in a temple part 10t on one eye side. The optical scanning unit 15 and the projection optical system 16 may be arranged on the right eye side or the left eye side, and have a function of projecting a video on the retinal of the eye on whose side the optical scanning unit 15 and the projection optical system 16 are arranged.

The optical scanning unit 15 scans an incident laser beam in two dimensions. The scanned laser beam is used for projecting a two-dimensional video image directly on the retinal of an eyeball 500 of the user of the display apparatus 1 via the lens 161 and the half mirror 162.

The optical scanning unit 15 includes, for example, a mirror that swings (vibrates) with respect to two axes orthogonal to each other. The optical scanning unit 15 may be, for example, a MEMS (Micro Electro Mechanical Systems) made by a semiconductor process, etc. The mirror of the optical scanning unit 15 may be driven by, for example, an actuator that uses deforming forces of piezoelectric elements as drive forces. It should be noted that the projection optical system 16 may include optical parts, etc., other than the lens 161 and the half mirror 162.

Figure 3:
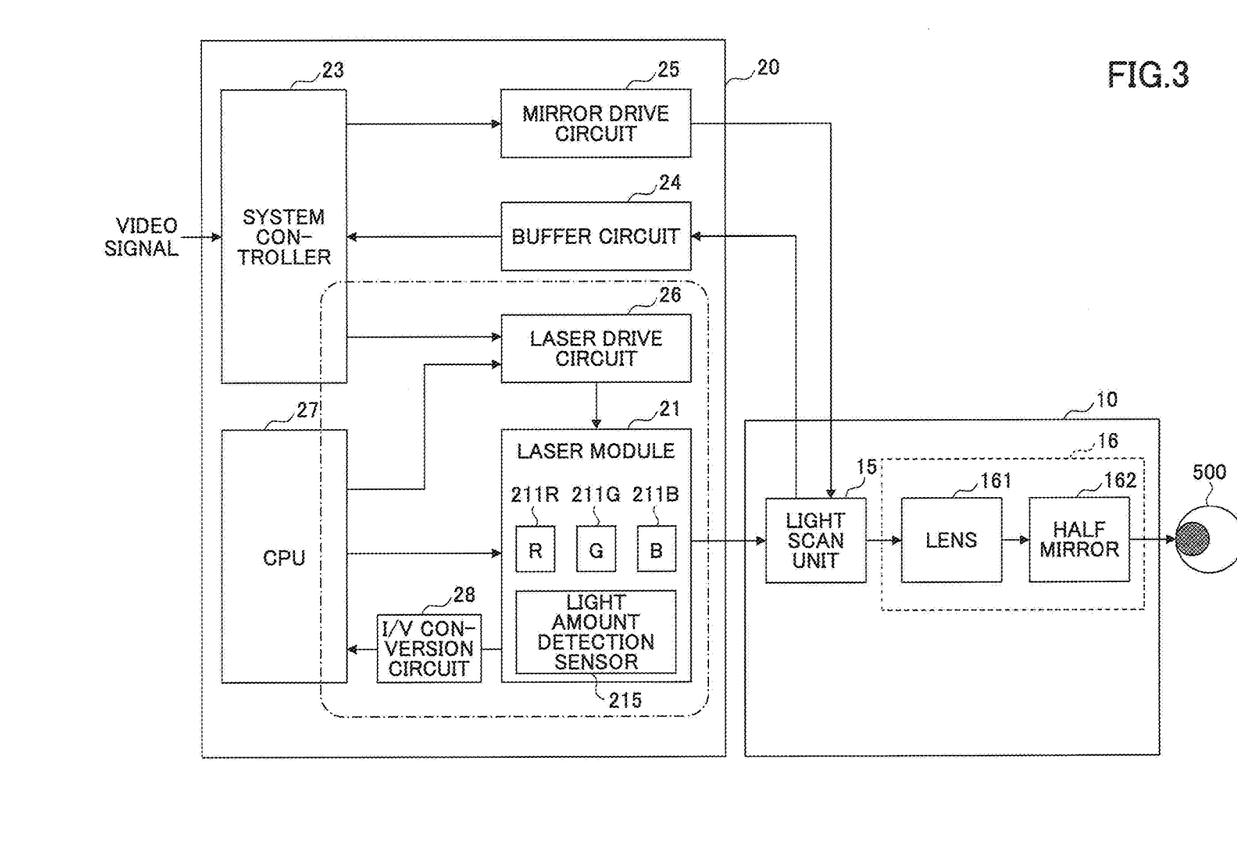
FIG. 3 is an example of a block diagram illustrating a control apparatus according to an embodiment of the present invention.

FIG. 3 is an example of a block diagram illustrating a control apparatus according to an embodiment of the present invention. It should be noted that a section surrounded by a one-dot chain line in FIG. 3 indicates a part related to an APC control.

As illustrated in FIG. 3, in the control apparatus 20, a laser module 21 includes lasers 211R, 211G, and 211B, which emit laser beams having light amounts corresponding to a current value, and a light amount detection sensor 215 that monitors the immediate light amount of each of the lasers 211R, 211G, and 211B.

The laser 211R is, for example, a red semiconductor laser, and is capable of emitting light with a wavelength $\lambda R$ (e.g., 640 nm). The laser 211G is, for example, a green semiconductor laser, and is capable of emitting light with a wavelength $\lambda G$ (e.g., 530 nm). The laser 211B is, for example, a blue semiconductor laser, and is capable of emitting light with a wavelength $\lambda B$ (e.g., 445 nm).

As the light amount detection sensor 215, for example, a photodiode, etc., may be used. The light amount detection sensor 215 may be arranged at any position as long as it can detect the laser beam amount before entering the optical scanning unit 15.

The system controller 23 is capable of, for example, controlling a swing angle of the mirror (not shown) of the optical scanning unit 15. The system controller 23 is capable of monitoring, for example, a tilt of the mirror in the horizontal direction and vertical direction obtained by a horizontal displacement sensor (not shown) and a vertical displacement sensor (not shown), included in the optical scanning unit 15, via a buffer circuit 24, and is capable of providing an angle control signal to a mirror drive circuit 25. Further, based on the angle control signal from the system controller 23, the mirror drive circuit 25 is capable of driving (for scanning the beam) the mirror of the optical scanning unit 15 for a predetermined angle.

Further, for example, the system controller 23 is capable of providing, to the laser drive circuit 26, a drive signal corresponding to a digital video signal that is input from outside the control apparatus 20. It should be noted that "outside the control apparatus 20" refers to, for example, a personal computer, a camera module, etc.

The laser drive circuit 26 supplies predetermined electric currents to the lasers 211R, 211G, and 211B of the laser module 21 based on the drive signal from the system controller 23. According to the above operations, it is possible for the lasers 211R, 211G, and 211B to emit red light, green light, and blue light, respectively, whose light amounts are controlled based on the video signal, and it is possible to generate a color image, corresponding to the digital video signal that is input from outside the control apparatus 20, by mixing the red light, green light, and blue light.

Further, a CPU 27 is capable of providing a light amount control signal to the laser module 21 by, for example, monitoring originally emitted light amounts of the lasers 211R, 211G, and 211B based on a signal obtained by converting a current output of the light amount detection sensor 215 into a voltage by using an I/V conversion circuit 28. Electric currents to the lasers 211R, 211G, and 211B are controlled based on the light amount control signal from the CPU 27 so as to achieve predetermined outputs (light amounts). Here, the predetermined outputs are target light amounts that are determined based on the light amount of external light detected by the light amount detection sensor 215, and an amount deviated from the determined target light amount is feedback-controlled based on the output of the light amount detection sensor 215.

It should be noted that the light amount detection sensor 215 may include three sensors that independently detect the light amounts emitted from the corresponding lasers 211R, 211G, and 211B. Alternatively, the light amount detection sensor 215 may include only a single sensor. In this case, it is possible to control the light amounts emitted from the lasers 211R, 211G, and 211B by causing the lasers 211R, 211G, and 211B to sequentially emit light and by sequentially detecting the light amounts with the single sensor.

The laser beams having corresponding wavelengths emitted from the lasers 211R, 211G, and 211B are mixed by a dichroic mirror, etc. The mixed result is emitted onto the mirror of the optical scanning unit 15 of the attachment unit 10 via an optical fiber (not shown) in the transmission cable 30, and the light is scanned by the mirror. The laser beam, which has been scanned by the mirror of the optical scanning unit 15, is used for directly projecting a video image on the retinal of the user of the attachment unit 10 via the projection optical system 16, and it is possible for the user to view the video image with a predetermined brightness.

It should be noted that some of the arrows are omitted in FIG. 3. The CPU 27 is connected to the system controller 23, the buffer circuit 24, the mirror drive circuit 25, and the laser drive circuit 26, and it is specified that the initial settings of the system controller 23, the buffer circuit 24, the mirror drive circuit 25, and the laser drive circuit 26 (settings of output voltage value range, etc.) are performed by the CPU 27.

(Control of Laser Beam Amount)

Figure 4A:
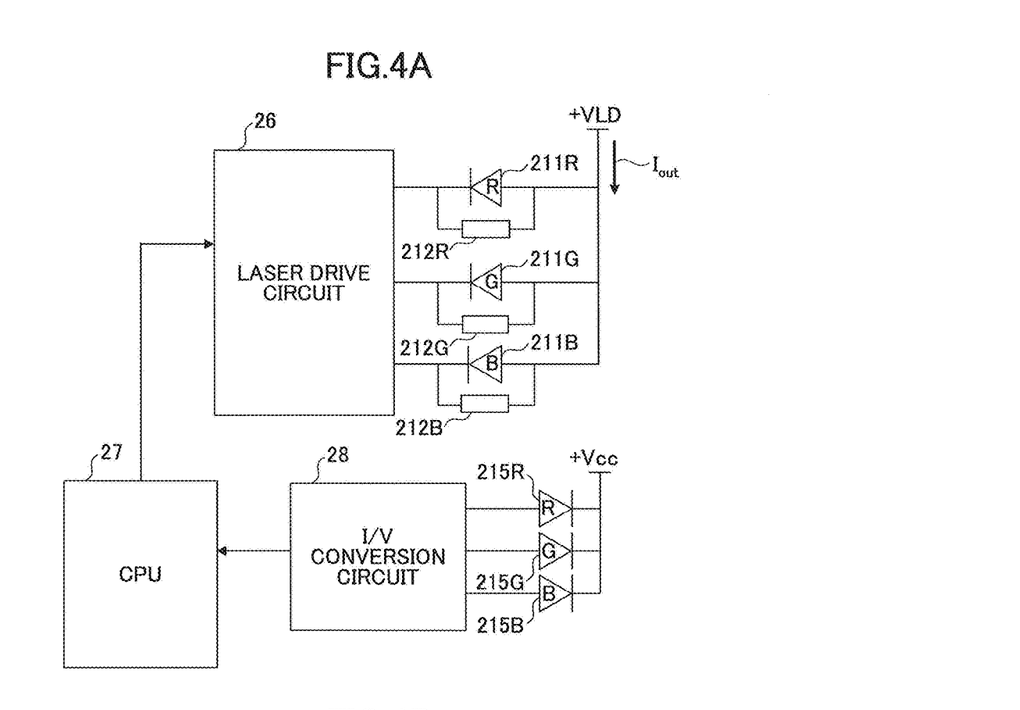
FIGS. 4A and 4B are drawings illustrating an APC control according to an embodiment of the present invention.
Figure 4B:
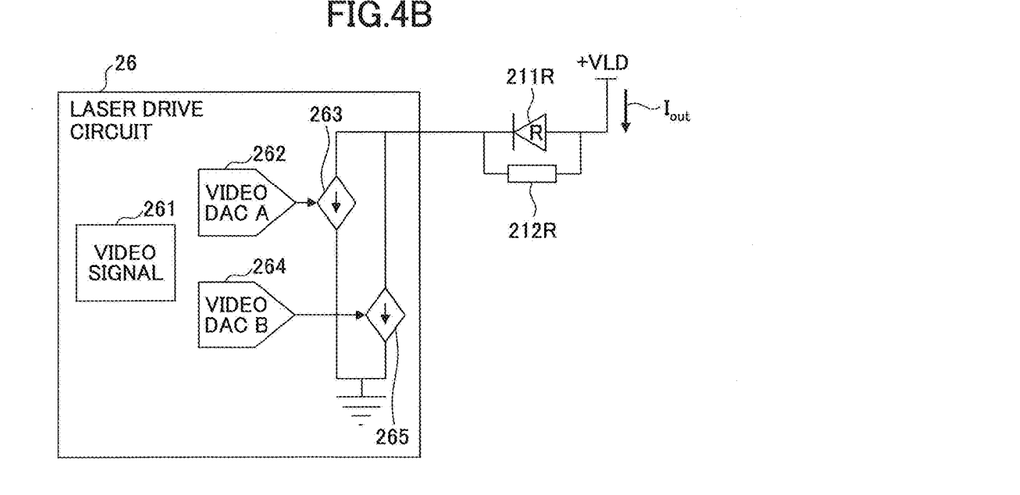
Figure 5:
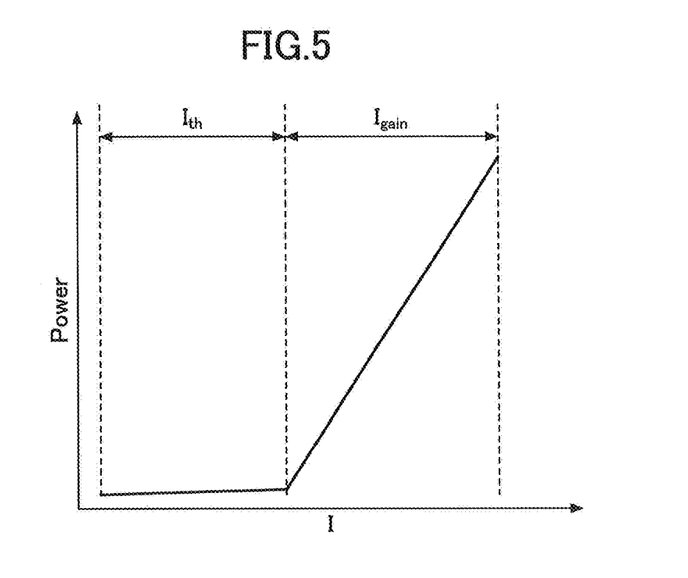
FIG. 5 is an example of I-L characteristics of a laser.

FIGS. 4A and 4B are drawings illustrating an APC control according to an embodiment of the present invention. FIG. 4A is a block diagram illustrating the portion surrounded by the one-dot chain line in FIG. 3 in detail. FIG. 4B is a block diagram illustrating the inside of the laser drive circuit 26 in a simple manner. FIG. 5 is an example of I-L characteristics of a laser.

The laser 211R, the laser 211 G, and the laser 211B that are used in the display apparatus 1 are low output lasers. The low output laser is a laser whose emission power is less than that of a laser with a typical output (emission power is about several ten mW). In the present specification, a laser, whose maximum emission power is equal to or less than 10 mW, is referred to as a low output laser. Further, there is a case in which a laser with a typical output, whose emission power is about several tens mW, is referred to as a standard output laser.

An operational current of the low output laser is less than that of the standard output laser, and is, for example, about a fifth of the operational current of the standard output laser.

As illustrated in FIG. 4A, an anode side of each of the lasers 211R, laser 211G, and the laser 211B is connected to a laser power supply VLD, and each cathode side is connected to the laser drive circuit 26. Further, a resistor 212R is connected in parallel with the laser 211R. Similarly, a resistor 212G is connected in parallel with the laser 211G, and a resistor 212B is connected in parallel with the laser 211B. The resistors 212R, 212G, and 212B are representative examples of a shunting element according to an embodiment of the present invention.

The laser drive circuit 26 has a function of supplying currents to the lasers 211R, 211G, and 211B, and the resistors 212R, 212G, and 212B. The laser drive circuit 26 is not a dedicated drive circuit that is dedicatedly (exclusively) designed for a low output laser, but is a drive circuit designed for the standard output laser. Therefore, the laser drive circuit 26 is designed in such a way that the current value can be adjusted on a discrete basis in an operational current range that is higher than an operational current of the low output laser (i.e., in an operational current range for the standard output laser).

The light amount detection sensor 215 includes sensors 215R, 215G, and 215B for independently detecting the light amounts emitted from the lasers 211R, 211G, and 211B. The sensors 215R, 215G, and 215B are, for example, photodiodes.

As illustrated in FIG. 4B, the laser drive circuit 26 includes a VIDEO DAC A 262, a current source 263, a VIDEO DAC B 264, and a current source 265 for generating currents representing video images. The VIDEO DAC A 262 and the current source 263 supply a current in an $I_{gain}$ region in the I-L characteristics in FIG. 5 to a laser, and the VIDEO DAC B 264 and the current source 265 supply a current in an $I_{th}$ region in the I-L characteristics illustrated in FIG. 5.

A VIDEO SIGNAL 261 allocates video data input from the system controller 23 to the $I_{gain}$ region and the $I_{th}$ region, and provides the allocated video data to the VIDEO DAC A262 and the VIDEO DAC B 264. It should be noted that the circuit illustrated in FIG. 4B is provided with respect to each of the lasers 211R, 211G, and 211B.

For example, when a maximum adjustment value of the VIDEO DAC A 262 is 320 mA, a maximum adjustment value of the VIDEO DAC B 264 is 80 mA, and the video signal has 256 tones, the resolution of the VIDEO DAC A 262 is 1.25 mA, and the resolution of the VIDEO DAC B 264 is 0.313 mA.

Figure 6:
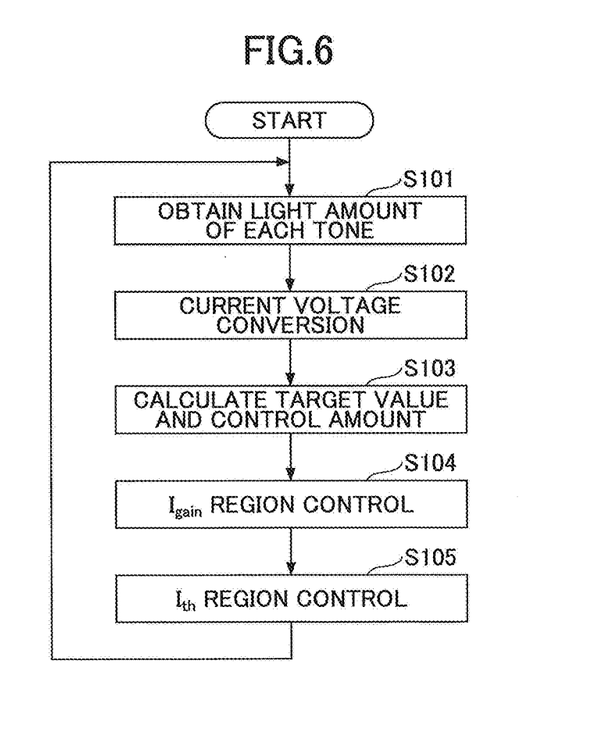
FIG. 6 is an example of a flowchart of the APC control.

FIG. 6 is an example of a flowchart of the APC control. First, in step S101, the light amount detection sensor 215 obtains a light amount of each tone as a current value. Next, in step S102, the I/V conversion circuit 28 converts the current value obtained by the light amount detection sensor 215 to a voltage value that can be processed by the CPU 27, and provides the converted voltage value to the CPU 27.

Next, in step S103, the CPU 27 calculates a target value of the light amount of each laser and a control amount.

Next, in step S104 and step S105, the laser drive circuit 26 controls each laser in such a way that each laser emits light with the adjusted light amount based on the target value and the control amount calculated by the CPU 27. At this time, an $I_{gain}$ region control is performed by the VIDEO DAC A 262 and the current source 263, and an $I_{th}$ region control is performed by the VIDEO DAC B 264 and the current source 265.

The calculation of the control amount will be described below. An $I_{out}$ in FIGS. 4A and 4B can be calculated according to $I_{out}=(xxh/FFh)*(yyh/FFh)*a$. Here, "(xxh/FFh)" is the video data (color tone), "(yyh/FFh)" is laser current gain register setting, and "a" is a maximum adjustment value (rated current) of each of the VIDEO DACs of the laser drive circuit 26.

Figure 7A:
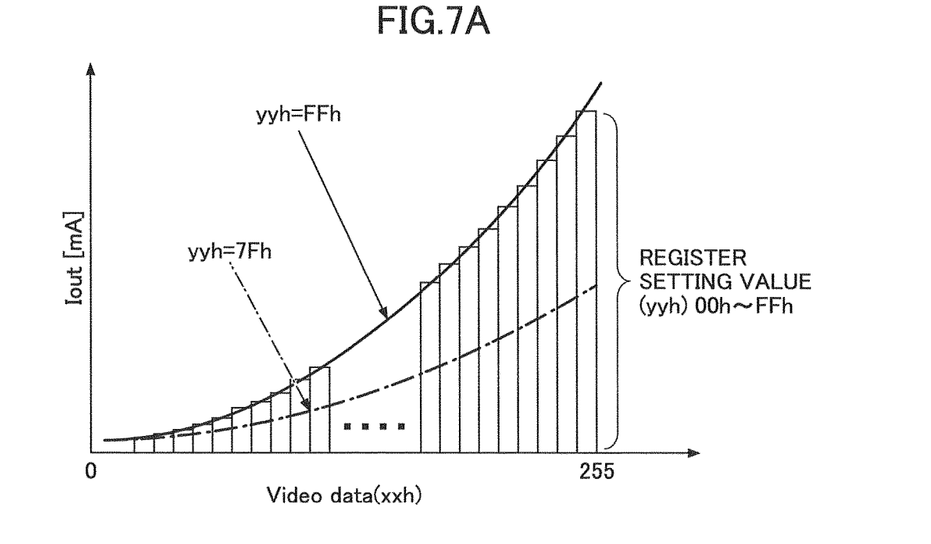
FIGS. 7A and 7B are drawings illustrating resolution improvement of register setting.
Figure 7B:
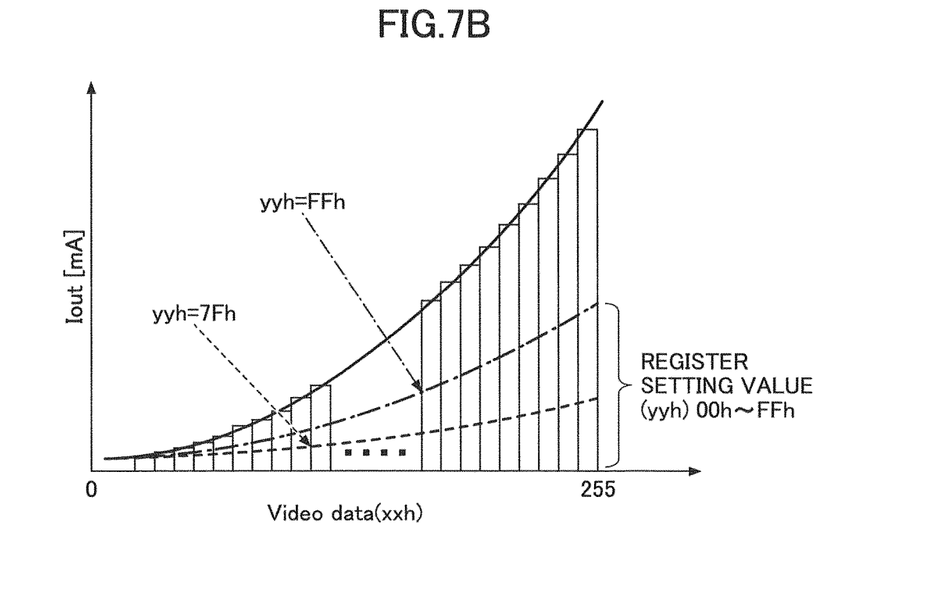

The relationship between the gain register value and $I_{out}$ changes according to whether or not a resistor 212 R equivalent to the laser 211R is connected in parallel with the laser 211R. FIG. 7A illustrates the relationship between the video data and $I_{out}$ in the case where a resistor 212 R equivalent to the laser 211R is not connected in parallel with the laser 211R. FIG. 7B illustrates the relationship between the video data and $I_{out}$ in the case where a resistor 212 R equivalent to the laser 211R is connected in parallel with the laser 211R.

In either case of FIG. 7A or FIG. 7B, when the gain register setting is changed, the inclination (slope) with respect to the video data is changed. However, in the case where a resistor 212 R equivalent to the laser 211R is connected in parallel with the laser 211R, as illustrated in FIG. 7B, it is possible to cause the set gain value to be half. In other words, when the same gain register setting is applied to the same video data, an obtained $I_{out}$ in FIG. 7B is a half of the $I_{out}$ in FIG. 7A.

This means that the resolution of the register setting is improved when a resistor 212R is connected in parallel with the laser 211R. In the case where a resistor 212 R equivalent to the laser 211R is connected in parallel with the laser 211R, the resolution of the register setting is doubled. It is possible to improve the resolution of the register setting to a predetermined value by adjusting the value of the resistor 212R.

Next, a method of calculating the value of the resistor that is connected in parallel with each laser will be described. The method of calculating the resistor 212R that is connected in parallel with the laser 211R is the same as the method of calculating the resistor 212G that is connected in parallel with the laser 211G, and is the same as the method of calculating the resistor 212B that is connected in parallel with the laser 211B. Therefore, here, as illustrated in FIG. 8, the method of calculating a resistor 212R in the case where the resistor 212R that is connected in parallel with the laser 211R will be described.

Figure 8:
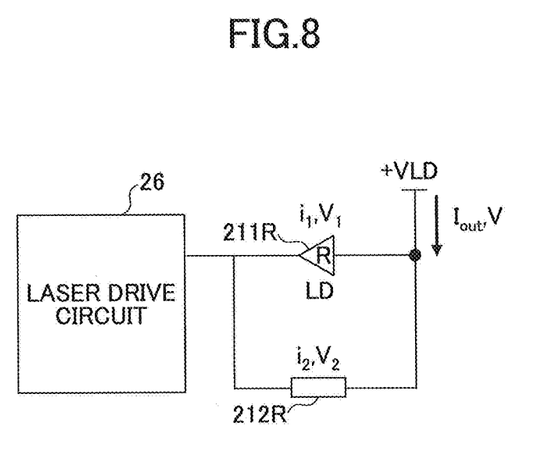
FIG. 8 is a drawing illustrating a method of calculating a resistor (resistance) that is connected in parallel with a laser.

In FIG. 8, "$I_{out}$" is a current supplied from a laser power supply VLD, "$i_1$" is a current that flows through the laser 211R, "$i_2$" is a current that flows through the resistor 212R, "V1" is a voltage across the laser 211R, and "V2" is a voltage across the resistor 212R.

In FIG. 8, $I_{out}=i_1+i_2$, and V=V1=V2. Therefore, when the resistance value of the resistor 212R is referred to as "R", $i_2=V/R$.

Figure 9:
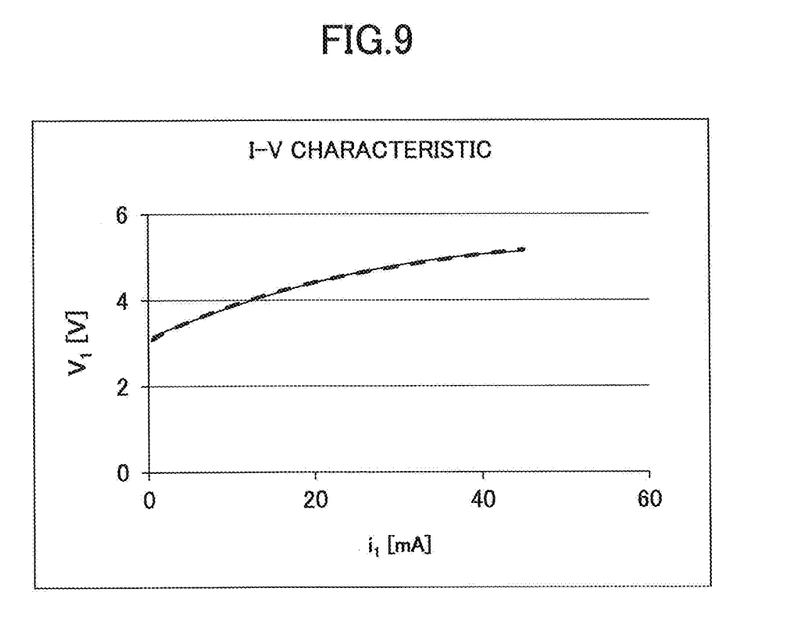
FIG. 9 is an example of I-L characteristics of a laser.

Further, the I-V characteristics of the laser 211R are, for example, as shown in FIG. 9, which is referred to as a function $f_i(V)$. A unique "I" can be obtained from a given "V" according to $f_i(V)$. Therefore, $i_1=f_i(V)$. Considering the fact that $I_{out}=i_1+i_2$ and $i_2=V/R$, the following formula 1 is obtained.

$$I_{out}=f_i(V)+V/R \quad \text{(formula 1)}$$

Here, a case is considered in which the resolution is doubled. In this case, $i_1=i_2$. $I_{out}=i_1+i_2=V/R+V/R=2V/R$. According to the above, together with the formula 1, an equation $f_i(V)=V/R$ is obtained. By transforming the equation, the following formula 2 can be derived.

$$R=V/f_i(V) \quad \text{(formula 2)}$$

According to the formula 2, the value of a resistor that is connected in parallel with each color of the lasers, and that is used for doubling the resolution, is shown in Table 1. As illustrated in Table 1, resistors with different resistance values are connected in parallel with the corresponding lasers having different emission wavelengths (having different colors).

TABLE 1

|  |  | $i_2$[mA] | $f_i(V)$ [V] | R[Ω] |
|---|---|---|---|---|
| LOW OUTPUT LD | RED | 35 | 2.28 | 65 |
|  | GREEN | 40 | 5.02 | 126 |
|  | BLUE | 20 | 4.24 | 212 |

Figure 10:
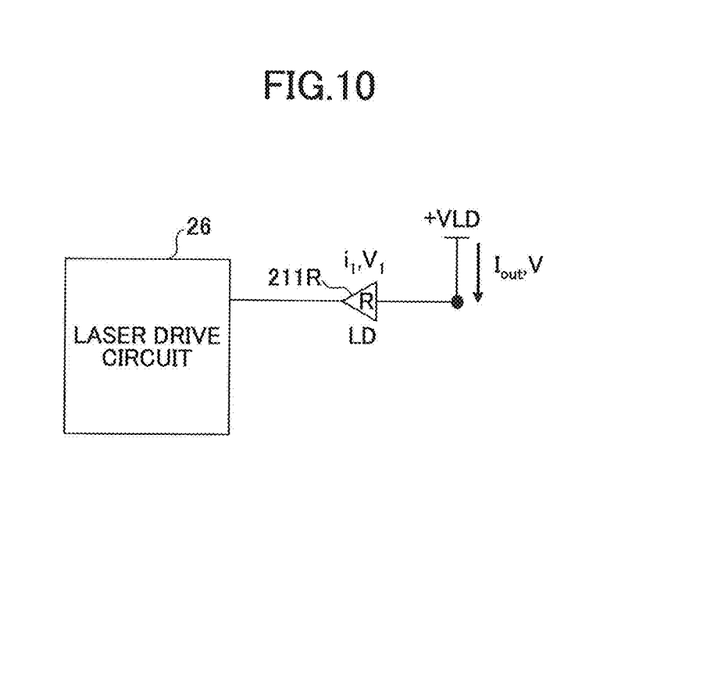
FIG. 10 is a conventional circuit as a comparative example.

Here, as a comparative example, a case will be considered (described) in which the resistor 212R is not connected in parallel with the laser 211R. As illustrated in FIG. 10, in the case where the resistor 212R is not connected in parallel with the laser 211R, $I_{out}=i_1$, and V=V1. Therefore, according to the formula 1, $I_{out}=f_i(V)$.

Figure 11:
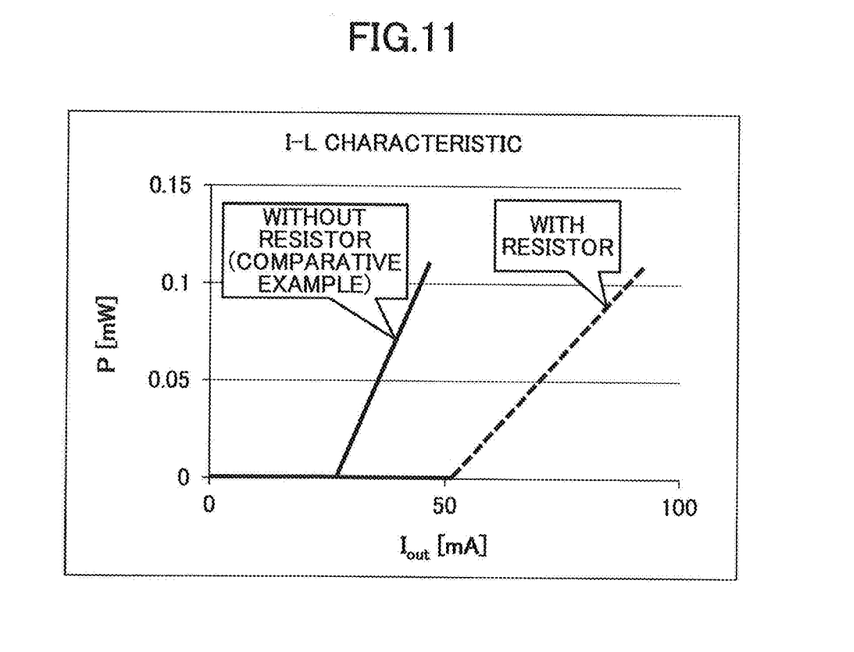
FIG. 11 is a drawing illustrating comparison of I-L characteristics between a case with a resistor and a case without a resistor.

On the other hand, in the case where the resistor 212R is connected in parallel with the laser 211R, according to the formula 1 and the formula 2, $I_{out}=2fi$ (V). The above descriptions mean that, in the circuit illustrated in FIG. 8, compared with the circuit of a comparative example illustrated in FIG. 10, when outputting the same power P, the $I_{out}$ is doubled as illustrated in FIG. 11. It should be noted that, in FIG. 11, compared with a case without a resistor, the $I_{th}$ region in a case with a resistor is doubled, and the inclination (slope) of the I-L characteristics in the $I_{gain}$ region is ½.

Similar to the previous case, when a maximum adjustment value of the VIDEO DAC A 262 is 320 mA, a maximum adjustment value of the VIDEO DAC B 264 is 80 mA, and the video signal has 256 tones, the resolution of the VIDEO DAC A 262 is 1.25 mA, and the resolution of the VIDEO DAC B 264 is 0.313 mA.

$I_{th}$, $I_{op}$, and a resolution per level, in a case of a conventional circuit of the comparative example illustrated in FIG. 10, are illustrated in Table 2. It should be noted that "$I_{th}$" illustrated in Table 2 is a current at which each of the lasers starts oscillation, and "$I_{op}$" is an operational current at the time of a standard output of each of the lasers. "$I_{op}$" belongs to the $I_{gain}$ region.

In Table 2, in order to compare with a case of a laser with a typical output (i.e., standard output laser), example values of a case of a laser with a typical output are also illustrated. According to Table 2, in case of the conventional circuit of the comparative example illustrated in FIG. 10, when a laser with a typical output is compared with a low output laser for each color, the resolution with a low output laser is five times rougher than the resolution with a laser with a typical output.

TABLE 2

|  |  | $I_{th}$[mA] | $I_{op}$[mA] | RESOLUTION PER LEVEL (%) |
|---|---|---|---|---|
| LD WITH TYPICAL OUTPUT | RED | 70 | 190 | 0.66 |
|  | GREEN | 40 | 220 | 0.57 |
|  | BLUE | 30 | 110 | 1.14 |
| LOW OUTPUT LD | RED | 23 | 35 | 3.57 |
|  | GREEN | 28 | 40 | 3.13 |
|  | BLUE | 10 | 20 | 6.25 |

Next, regarding the circuit illustrated in FIG. 8, the resolution for each color in the case where $i_1=i_2$ as shown in Table 1 will be calculated as follows. In case of red color, according to Table 1, $i_1=i_2=35$ mA. Therefore, $I_{out}=i_1+i_2=70$ mA. The resolution 1.25 mA of the VIDEO DAC A 262 is translated as an adjustment width (a unit of adjustment) 1.79% for 70 mA. Similarly, calculation results of resolutions (adjustment widths) in case of green color and blue color are illustrated in Table 3.

TABLE 3

|  | $I_{th}$[mA] | $I_{op}$[mA] | RESOLUTION PER LEVEL (%) | RESOLUTION AFTER RESISTOR CONNECTION (%) |
|---|---|---|---|---|
| RED | 23 | 35 | 3.57 | 1.79 |
| GREEN | 28 | 40 | 3.13 | 1.56 |
| BLUE | 10 | 20 | 6.25 | 3.13 |

In Table 3, the resolution per level is a resolution of the register setting in a case where a resistor is not connected in parallel with the laser (i.e., the value illustrated in Table 2). It is known from Table 2 that the resolution of register setting for each color is doubled by connecting a resistor in parallel with the laser. It is also possible to increase the resolution of register setting further by changing the ratio between $i_1$ and $i_2$ by adjusting the value of the resistor that is connected in parallel with the laser.

A semiconductor laser is characterized in that the characteristics change according to external factors such as the temperature. The change of the characteristics has a big impact on the color tone of the video to be projected. Therefore, in the video projection method that uses a laser as a light source, it is necessary to control the light amount according to the characteristics change. This control is automatically provided by the automatic power control (APC) of the white balance.

As described above, when the resolution of the register setting is improved, the accuracy of the white balance APC adjustment is improved. According to the above, compared with the conventional technique, it is possible to maintain the quality of video image without causing the quality to be degraded from the conventional quality. In other words, it is possible to cause the adjustment width of the laser current to be finer (smaller) by increasing the resolution of register setting by connecting a resistor in parallel with the laser, and thus, it is possible to increase the accuracy of the white balance APC adjustment.

Figure 12A:
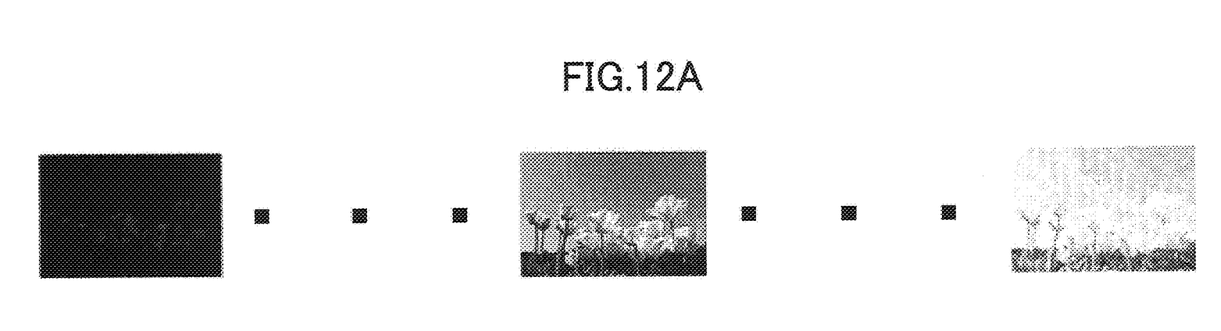
FIGS. 12A and 12B are drawings illustrating white balance adjustment.
Figure 12B:
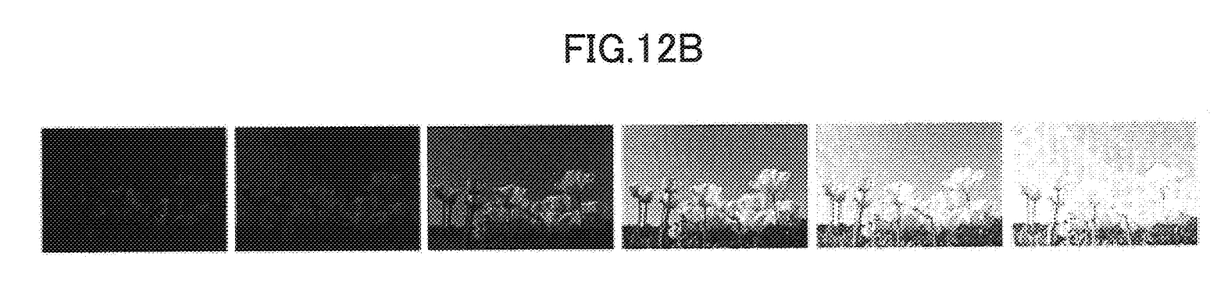

FIG. 12A and FIG. 12B are drawings illustrating the white balance adjustment. FIG. 12A illustrates a case in which the resolution of the register setting is low and the adjustment width of the laser current is rough (large) (a case of FIG. 10). FIG. 12B illustrates a case in which the resolution of the register setting is high and the adjustment width of the laser current is fine (small) (a case of FIG. 8). Further, in FIG. 12A and FIG. 12B, pictures next to each other indicate a case in which the laser current is changed by one adjustment width.

As illustrated in FIG. 12A, in the case where the resolution of register setting is low and the adjustment width of the laser current is coarse, the adjustment width is not sufficient (is too large) (in this example, there are only three adjustable current levels), and, when the laser current is changed by one adjustment width, the brightness changes greatly. In particular, it is difficult to control the white balance with the low output laser whose $I_{gain}$ region is small.

On the other hand, as illustrated in FIG. 12B, in the case where the resolution of register setting is high and the adjustment width of the laser current is fine, the adjustment width is sufficient (is small enough) (in this example, there are six adjustable current levels), and, when the laser current is changed by one adjustment width, the brightness changes slightly. According to the above, it becomes easy to control the white balance with the low output laser whose $I_{gain}$ region is small.

As described above, the fineness of the adjustment width of the laser current is related to the adjustment accuracy of the brightness (white balance) of the video image projected by the display apparatus 1. Further, it becomes possible to improve the adjustment resolution of the current value of the laser current by increasing the resolution of register setting by connecting a resistor in parallel with the laser, and thus, it is possible to increase the white balance APC, adjustment accuracy. As a result, in a display apparatus 1 in which the low output laser is driven by a drive circuit for the standard output laser, it becomes possible to project a video image with a stable image quality and without depending on the temperature change.

<Modified Example of First Embodiment>

In a modified example of the first embodiment, an example is shown in which a shunting element, other than a resistor, is connected in parallel with the laser. It should be noted that, in the modified example of the first embodiment, descriptions related to the same structure as the first embodiment may be omitted.

Figure 13:
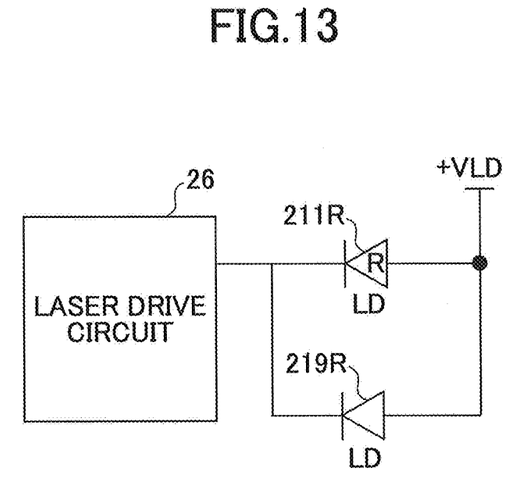
FIG. 13 is a drawing illustrating an example in which a shunting element, other than the resistor, is connected in parallel with a laser.

FIG. 13 is a drawing illustrating an example in which a shunting element, other than a resistor, is connected in parallel with the laser. In a circuit illustrated in FIG. 13, a laser 219R is connected in parallel with the laser 211R. The similar circuits are used for the lasers 211G and 211B (drawings are omitted).

In the circuit illustrated in FIG. 13, it is possible to cause the currents that respectively flow through the laser 211R and the laser 219R to be substantially the same by using, as the laser 219R, a laser that has the same specification as the laser 211R. Therefore, similar to the case in which the resistor 212R that is equivalent to the laser 211R is connected in parallel with the laser 211R, it is possible to cause the set gain value to be half.

According to the above, similar to the first embodiment, it becomes possible to improve the adjustment resolution of the current value of the laser current, and it becomes possible to increase the white balance APC, adjustment accuracy. As a result, in a display apparatus 1 in which the low output laser is driven by a drive circuit for the standard output laser, it becomes possible to project a video image with a stable image quality and without depending on the temperature change.

Further, it is also possible to further increase the resolution of register setting by changing the ratio between $i_1$ and $i_2$ by connecting a laser with an appropriate specification in parallel with the laser 211R. It should be noted that the laser 219R is used for the current value adjustment, and is not intended to be used for forming an image. Therefore, it is necessary to provide measures for preventing the emitted light of the laser 219R from affecting the images.

In the circuit in FIG. 13, instead of the laser 219R, a diode other than a laser, a variable resistor, etc., may be used. In the case where a variable resistor is used, it is possible to cause the resolution of the register setting to be variable, which is preferable, The CPU 27 may adjust the setting of the variable resistor (resistance value).

As described above, preferable embodiments have been described. However, the present invention is not limited to the above-described embodiments. Various modifications and replacements can be applied to the above-described embodiments without departing from the scope of the claims.

The present application is based on and claims the benefit of priority of Japanese Priority Application No. 2017-069782 filed on Mar. 31, 2017, the entire contents of which are hereby incorporated herein by reference.

What is claimed is:

1. A retinal scanning type display apparatus, the display apparatus comprising:
    a low output laser whose operational current is lower than a standard output laser;
    a shunting element; and
    a drive circuit that is a standard output laser drive circuit and is capable of adjusting a current value on a discrete basis in a range of an operational current higher than the operational current of the low output laser;
    wherein the shunting element is connected in parallel with the low output laser,
    wherein the standard output laser drive circuit supplies a first current to the low output laser and the shunting element connected in parallel with the low output laser, the first current being a sum of a second current supplied to the low output laser and a third current supplied to the shunting element, and wherein the second current that is supplied to the low output laser can be adjusted on a discrete basis in a range of an operational current of the low output laser by adjusting the first current on a discrete basis in a rage of operational current higher than the operational current of the low output laser.

2. The display apparatus according to claim 1, wherein the low output laser includes a plurality of the low output lasers having different emission light wavelengths, and the shunting elements having different characteristics are connected in parallel with the corresponding low output lasers.

3. The display apparatus according to claim 1, wherein the shunting element is a resistor.

4. The display apparatus according to claim 2, wherein the shunting elements having different characteristics are resistors having different resistance values.

5. The display apparatus according to claim 1, wherein the low output laser is a laser that is used with emission power equal to or less than 10 mW.

* * * * *